(12) United States Patent
Libert et al.

(10) Patent No.: US 12,234,045 B2
(45) Date of Patent: Feb. 25, 2025

(54) DRONE PROTECTION AGAINST HIGH-VOLTAGE ELECTRICAL DISCHARGES AND CORONA EFFECT

(71) Applicant: Ampacimon S.A., Grace-Hollogne (BE)

(72) Inventors: Thibaut Libert, Flemalle (BE); Daniel Mitcan, Eindhoven (NL); Thibault Dasnoy, Brussels (BE)

(73) Assignee: Ampacimon S.A., Grace-Hollogne (BE)

( * ) Notice: Subject to any disclaimer, the term of this patent is extended or adjusted under 35 U.S.C. 154(b) by 0 days.

(21) Appl. No.: 18/673,064

(22) Filed: May 23, 2024

(65) Prior Publication Data

US 2024/0308701 A1    Sep. 19, 2024

Related U.S. Application Data

(63) Continuation of application No. PCT/EP2022/083268, filed on Nov. 25, 2022.

(30) Foreign Application Priority Data

Nov. 29, 2021   (EP) .................................... 21210961

(51) Int. Cl.
   *B64U 30/29*       (2023.01)
   *B64U 101/00*      (2023.01)
   *H02G 1/02*        (2006.01)

(52) U.S. Cl.
   CPC .......... *B64U 30/29* (2023.01); *B64U 2101/00* (2023.01); *B64U 2201/20* (2023.01); *H02G 1/02* (2013.01)

(58) Field of Classification Search
   CPC ................ B64U 30/29; B64U 2201/20; B64U 2101/00; B64U 2101/26; B64U 20/00;
   (Continued)

(56) References Cited

U.S. PATENT DOCUMENTS 9,932,110 B2     4/2018  Mcnally
10,501,181 B1 *  12/2019 Dorr ........................ H04B 5/73
(Continued)

FOREIGN PATENT DOCUMENTS

CN    110077607 A    8/2019
EP      3832822 A1   6/2021
(Continued)

OTHER PUBLICATIONS

International Search Report and Written Opinion of the International Searching Authority from the European Patent Office, in PCT/EP2022/083268 dated Feb. 17, 2023, which is an international application to which this application claims priority.

*Primary Examiner* — Benjamin P Lee
(74) *Attorney, Agent, or Firm* — Kolitch Romano Dascenzo Gates LLC

(57) ABSTRACT

A remotely controlled flying device is intended to approach and contact a high-voltage overhead power line for operation thereon. The flying device includes a mechanical structure bearing propellers and an aircraft body containing at least a power hub, a flight controller, and radio communication means. An electrical shield encapsulates the mechanical structure. The remotely controlled flying device also has a surge protector or the like designed to locally capture and guide toward the electrical shield possible electric discharges in the phase of power line approaching and/or contacting and to render the electrical shield equipotential with the power line.

15 Claims, 5 Drawing Sheets

(58) Field of Classification Search
CPC .... H02G 1/02; G01R 31/085; G01R 19/2513; G01S 5/06
See application file for complete search history.

(56) References Cited

U.S. PATENT DOCUMENTS

| | | | |
|---|---|---|---|
| 10,899,475 B1* | 1/2021 | Freeman, Jr. | B64U 50/34 |
| 11,368,002 B2* | 6/2022 | Lavoie | H02G 1/02 |
| 2016/0200415 A1 | 7/2016 | Cooper | |
| 2017/0015414 A1* | 1/2017 | Chan | B64U 10/14 |
| 2017/0168107 A1* | 6/2017 | Vinogradova | B64D 47/00 |
| 2018/0157250 A1* | 6/2018 | Barnickel | G05D 1/0011 |
| 2019/0176984 A1* | 6/2019 | Wabnegger | B64U 20/30 |
| 2020/0317336 A1* | 10/2020 | Beiro | H04B 3/46 |
| 2021/0061463 A1* | 3/2021 | Briod | B64U 30/24 |
| 2021/0273422 A1* | 9/2021 | Lavoie | H02G 1/02 |
| 2023/0384078 A1* | 11/2023 | Beiro | G01B 3/205 |
| 2024/0034489 A1* | 2/2024 | Beiro | B64D 1/22 |

FOREIGN PATENT DOCUMENTS

| | | | | |
|---|---|---|---|---|
| FR | 3055419 A1 * | 3/2018 | | B64C 39/024 |
| WO | WO2018117627 A1 | 6/2018 | | |
| WO | WO2019113424 A1 | 6/2019 | | |

\* cited by examiner

DRONE PROTECTION AGAINST HIGH-VOLTAGE ELECTRICAL DISCHARGES AND CORONA EFFECT

CROSS REFERENCES

The following application is incorporated herein, in its entirety, for all purposes: International Patent Application Number PCT/EP2022/083268, filed on 25 Nov. 2022. However, such material is only incorporated to the extent that no conflict exists between the incorporated material and the statements and drawings set forth herein. In the event of any such conflict, including any conflict in terminology, the present disclosure is controlling.

FIELD

The present disclosure relates to the design of a remotely controlled flying machine intended, in a purpose of alleviating operator risk related to high-voltage power lines, to approach such power lines, to land and to momentarily anchor itself thereon, with operative purposes such as installing a sensor.

BACKGROUND

In the field of electrical engineering, the use of general devices protecting against high-voltage (HV) discharges, such as surge arresters or the like, is well-known, such devices being installed on electricity towers or high buildings in residential and industrial areas.

Typically, operating under tension, for example performing maintenance or installing a sensor on a power line, requires specialized teams of linemen, certified for working on energized power lines. These operations are carried out for example by using special protection equipment and devices such as hot sticks, bucket trucks and isolated grounding or using helicopters when the terrain or altitude does not permit sufficient physical proximity. In these situations the crew members are continuously exposed to HV risks.

A known alternative to operating under tension is to de-energize the power lines, install the devices and then reenergize the power lines. In practice, this operation requires establishing schedules months in advance as well as careful execution, as the power lines are normally continuously employed to transport energy to end-users, let alone the costs associated with such de-energization that can easily reach hundreds of thousands of US dollars.

In prior art, very little is known about how to protect unmanned devices, especially flying devices of the type unmanned aerial vehicle (UAV) or drone, when they are approaching in operation an aerial energized power line, particularly an aerial HV power line.

In order to alleviate the operational risks and hazards, as well as to reduce installation costs associated with mounting devices and with operating maintenance on energized power lines, a reliable solution for controlling and protecting these devices against electrical discharges is required.

Document FR 3 055 419 A1 to SCHNEIDER lies in the field of installing sensors for monitoring the flow of electrical energy in an electrical distribution network. It relates to a system for installing a sensor on an overhead line, an assembly comprising a sensor and such a system for installing the sensor, and a method for installing the sensor. The sensor includes a hooking mechanism for hooking the sensor to the overhead line. According to the present disclosure, the installation system comprises: —an aerial drone arranged to be able to come and hover in the vicinity of the overhead line, —a supporting structure arranged to accommodate the sensor, and—a connecting element between the aerial drone and the supporting structure, the supporting structure comprising a release mechanism arranged to assume a holding state in which it is able to hold the sensor on the supporting structure and a release state in which it is able to release the sensor from the supporting structure.

Document U.S. Pat. No. 9,932,110 B2 to Mc NALLY discloses a method for using an unmanned aerial vehicle (UAV) to install objects on wire and catenary structures. The method includes tagging the location, attaching the object to the UAV, navigating the UAV to the position, attaching the object, testing the attachment, releasing the object, inspecting the attachment, and returning the UAV to the ground. Different clamping systems are envisaged to attach the UAV on power lines.

Hydro-Quebec Research Institute (HQRE) has developed a drone (called LineDrone) able to approach and land on an energized power line of up to 315 kV and, once on the line, travel to a target splice thanks to motorized wheels for measuring splice electrical resistance thanks to its motorized embedded probe. Beside a light structure bearing the propellers and the batteries in supplement of the above-mentioned motorized device, this drone does not seem to have special equipment to prevent damage provoked by discharges during the line approach phase.

Document EP 3 832 822 A1 to the same Applicant discloses a device adapted to be mounted on an energized overhead power line, comprising a casing composed of a first half and a second half, said halves having a mechanism positioned there between, wherein said halves respectively comprise a first half and a second half of a magnetic split-core. The halves of the casing are connected to each other through at least one strap configured to mate with the overhead power line in order to perform a clamping of the device onto said line. A length of the at least one strap is determined for allowing the at least one strap to guide and align the power line excursion between the halves of the casing, so that said halves are toggled in the closed position when the halves of the magnetic split-core surround said line due to an electromagnetic attraction between the halves of said split-core.

In the above solutions, the technical issue of protecting the aerial installing device against electrical discharges, corona effect and/or electromagnetic interference (EMI) has not been addressed.

Typically a drone will designate in this application a UAV or any autonomous flying device intended to approach an energized overhead power line, that has an intricate internal circuitry with a power hub, a radio receiver with antennas, a flight controller unit with autopilot GPS, IMU, sensors for detecting obstacles, camera with gimbal, etc. So many communications and data ports inevitably render the drones prone to electrical discharge damages, especially in the considered field. While conventional design approach in electronics would be to design devices resistant to electric arc discharges, yet in case of coupling a drone with HV environment there are so many sensitive components that it overcomplicates the design and complexity of individual components protection against electrical perturbations or surges.

Conceptually one alternative solution is to provide the external envelope of the drone with an at least partly metallic shielding usually called "Faraday cage". Such a solution has been implemented in document WO 2019/113424 A1 to QUANTA that discloses a remotely controlled unmanned aerial device for use in proximity or in contact with high-voltage power lines, including an unmanned aerial vehicle and an electrically conductive shield forming part of or operatively coupled thereto so as to encapsulate the unmanned aerial vehicle. When in the presence of a high-voltage power line, the unmanned aerial vehicle either when bonded-on or within the corresponding magnetic fields of the power line, so as to transfer the power line potential in whole or in part to the unmanned aerial vehicle, electrically energizes the conductive shield around the unmanned aerial vehicle while leaving components of the unmanned aerial vehicle within the shield substantially electrically unaffected by the voltage potential. In some embodiments, the device can be encased in an electrically conductive covering, which is adapted to provide an optimized Faraday cage around UAV and its attachments. Such a Faraday cage operates so that no externally originating electrical charge will flow through the contents of the Faraday shield or cage and that, instead, the electrical charge originating from the external source such as the voltage potential from bonding-on, will be confined to, and flow around the Faraday cage. Therefore, when the Faraday cage is optimized to protect against high-voltage surge upon bond-on, and encapsulates the UAV and its attachments, the UAV and its components will be electrically protected during a bond-on event. The Faraday cage for protecting UAV during bond-on may be made of a material which includes a blend of fire-retardant components and electrically conductive, metallic components. Thus, covering may be made of strands of electrically non-conductive or dielectric, fire-retardant fabric that is capable of being woven with electrically conductive metallic strands such as of steel, including those of stainless steel (e.g. a flexible material including 75% NOMEX® and KEVLAR® aramid fibers inter-woven with 25% stainless-steel fibers or strands) so as to form an electrically conductive, preferably flexible, woven fabric matrix.

Documents US 2016/200415 A1, CN 110077607 A and WO 2018/117627 A1 also teach some encasement structures of the propellers but only intended for mechanical protection of the user.

DEFINITIONS

Surge, overvoltage or discharge protecting devices can be classified in different categories:
  Surge arrester: device used to protect the electrical installations and equipment from electrical surges and transient voltage caused by electrical faults, switching, short circuits, sparks and lightning, etc. Surge arresters are generally installed inside the electric board panels to cancel out the surges. In particular, a surge arrester is connected on the one hand to a conductor just before it enters the equipment and on the other to ground and operates by routing energy from an over-voltage transient to ground as the case may be, while isolating the conductor from ground at normal operating voltages;
  Lightning arrester: device used to protect the electric circuit and connected devices from the lightning strikes having high-voltage transient surges. Lightning arresters are installed outside to ground the harmful effects of lightning spikes.
  Surge suppressor (or transient suppressor or surge protector): device generally installed in a home panel board to protect the connected circuits from electric surges and specific voltage spikes known as transients.
  Lightning rod: device installed atop buildings and transmission towers to provide a path to ground the lightning strokes. The lightning rod protects the structure from lightning surges.

Suitable surge protection devices of this kind for the present application are well-known of the skilled person and comprise for example varistors, TVS, zener and avalanche diodes, gas discharge tubes, thyristor surge protection devices, etc.

SUMMARY

The present disclosure aims to provide a protection system against HV electrical discharges as well as flying devices equipped with such a protection so that they can approach and land on energized power lines and withstand arc discharges typically up to 700 kV.

Another goal of the present disclosure is to provide a structure for the UAV approaching a power line so that it comes to an equipotential voltage with the energized line, as fast as possible and in a controlled manner, knowing that, in the approach phase, arc discharges will inevitably occur and should be guided toward the ground. The present disclosure thus aims at providing a new solution very different from prior-art complex engineered protections or shields against high voltage.

A first aspect of the present disclosure relates to a remotely controlled flying device intended to approach and contact a high-voltage overhead power line for operation thereon, said flying device comprising:
  a plurality of propellers;
  a mechanical structure bearing the plurality of propellers and an aircraft body containing at least a power hub, a flight controller and radio communication means; and
  an electrical shield encapsulating said mechanical structure and comprising an assembly of electrically conductive bars interconnected with electrically conductive connectors according to a truss or a lattice;
  wherein the remotely controlled flying device also comprises at least two anchoring spots, at least one thereof provided with a surge protector or the like comprising a mechanical part, preferably having a V-shape open to the exterior of the device, for guiding the power line in the flying phase of power line approaching and contacting, as well as for attracting possible electric discharges towards the electrical shield.

It will be under normal understanding of the skilled person that the surge, overvoltage, or discharge protecting device in the present disclosure (in short "surge protector or the like") may be the (V-shape) mechanical part alone as mentioned above or the same coupled or complemented with another protecting device as defined above and known of the skilled person (e.g. surge arrester, lightning arrester, surge suppressor, lightning rod, etc.).

According to preferred embodiments, the remotely controlled flying device comprises at least one of the following characteristics or a suitable combination thereof:
  said bars and connectors having a round shape and/or are polished;
  at least two linearly-disposed automatic clamping devices are provided for attaching the flying device to the power line, each of said clamping devices being preferably coupled with one of said surge protectors or the like;
  the linearly-disposed automatic clamping devices preferably coupled with said surge protectors or the like are located on the top part of the flying device;

the linearly-disposed automatic clamping devices are located in the vicinity of the V-shape mechanical parts, being capable to attach the flying device to the power line, once the flying device has approached upwards (i.e. from underneath) the power line so that the latter is located sufficiently close to the bottom of the V-shape mechanical part;

the clamping devices are claws mounted rotary in a plane orthogonal to the power line direction in use, said claws being preferably in permanent rotation until they grip the power line and stop;

an additional electrically conductive element connected to the V-shaped mechanical part is provided so as to ensure that, once a first contact has been established with the high-voltage power line, this contact remains active or permanent during the subsequent operations/phases and so as avoid any transient during the final approach phase;

the additional conductive elements are preferably flexible or spring metal blades mounted on the V-shape mechanical part;

the device further comprises a metallic mesh provided to cover the top part and the lateral part of said assembly of electrically conductive bars interconnected with connectors according to a truss or a lattice, and designed to allow unimpeded the air flow created by the rotation of the propellers;

the bottom side of the flying device has reduced or partial metallic mesh (7) covering or has a metallic mesh (7) with increased mesh size, to assure proper communication with a remote control on earth;

the electronics in the aircraft body is conventional electronics not having special protection against high-intensity electromagnetic fields;

the electrically conductive bars are made of/comprise carbon material and the connectors are made of/comprise an electrically conductive material which is light, rigid, possibly 3D-printable and having a surface small enough, so as not to hinder air flow;

the electrically conductive material is carbon, aluminum, titanium, copper or a material with an outside layer of copper, or a non-conductive material coupled to some conductive material, for example plastic bars with metal wires incorporated in a groove thereof or with wire strapping;

the device is designed to bear a payload device such as a sensor, and will be fitted with a dedicated/separate system, such as clamps, able to automatically fixate the sensor onto the power line, once the flying device has been firstly anchored to the power line and put at the electric potential thereof;

a transient suppressor is further connected in parallel with the ground and a main power supply bus;

the electrical shield is fitted to the external envelope of the mechanical structure or makes the external envelope thereof.

A second aspect of the present disclosure relates to a system comprising a remotely controlled flying device as described above, and a hosted payload such as a sensor.

A third aspect of the present disclosure relates to the use of a remotely controlled flying device as described above, for performing the following steps of:

approaching a high-voltage overhead power line by remote control or autonomously (trained mission);

anchoring the flying device by guiding the power line into or towards the surge protectors or the like;

clamping the flying device to the power line thanks to the automatic clamping devices;

anchoring a payload device such a sensor thanks to a dedicated anchoring mechanism;

releasing the automatic clamping devices and freeing the flying device from the power line; and bringing back the flying device to ground by remote control.

DETAILED DESCRIPTION

Figure 1A:
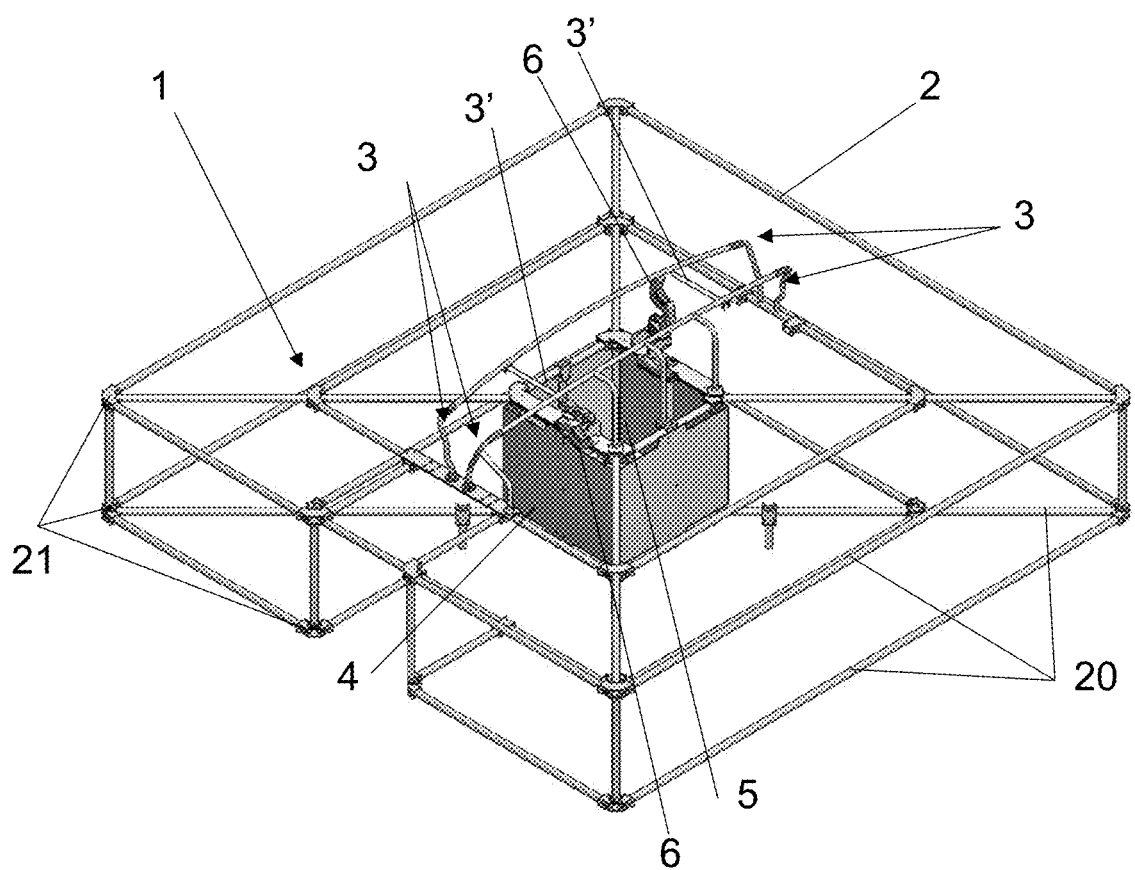
FIG. 1A is a complete schematic view in perspective of a controlled flying device intended to approach and contact a high-voltage power line for operation thereon, according to the present disclosure (propellers and batteries not shown for sake of clarity).
Figure 1B:
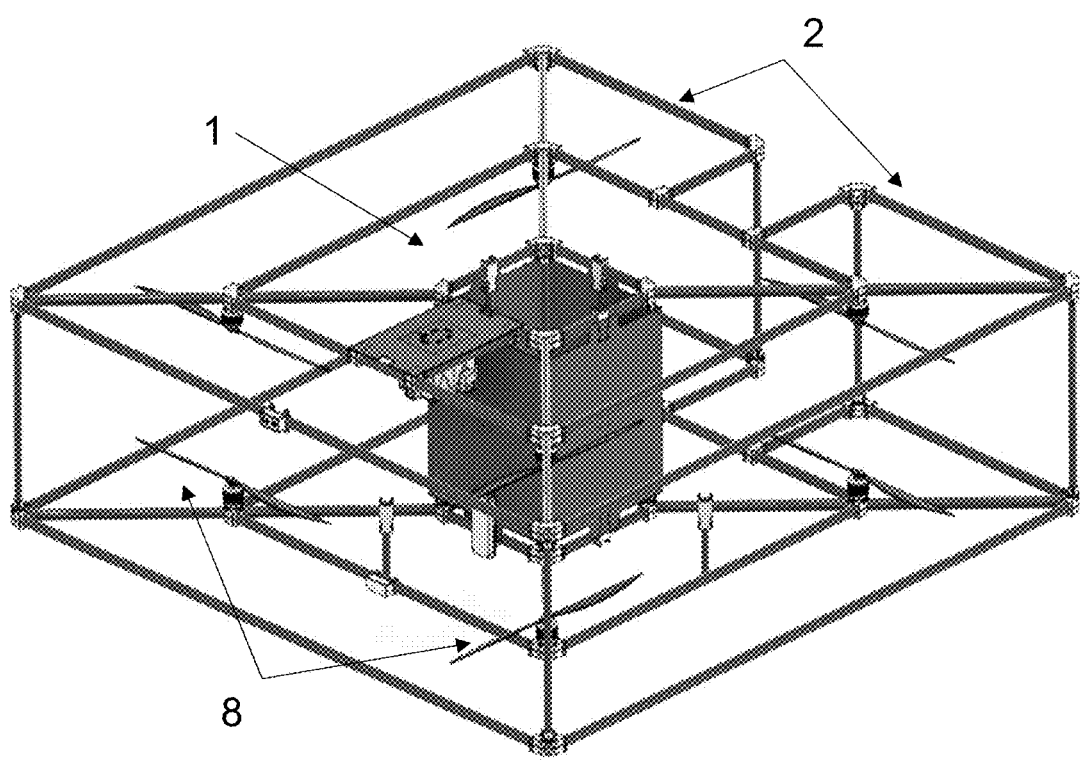
FIG. 1B is a similar view but showing only the metallic structure and the propellers.
Figure 2:
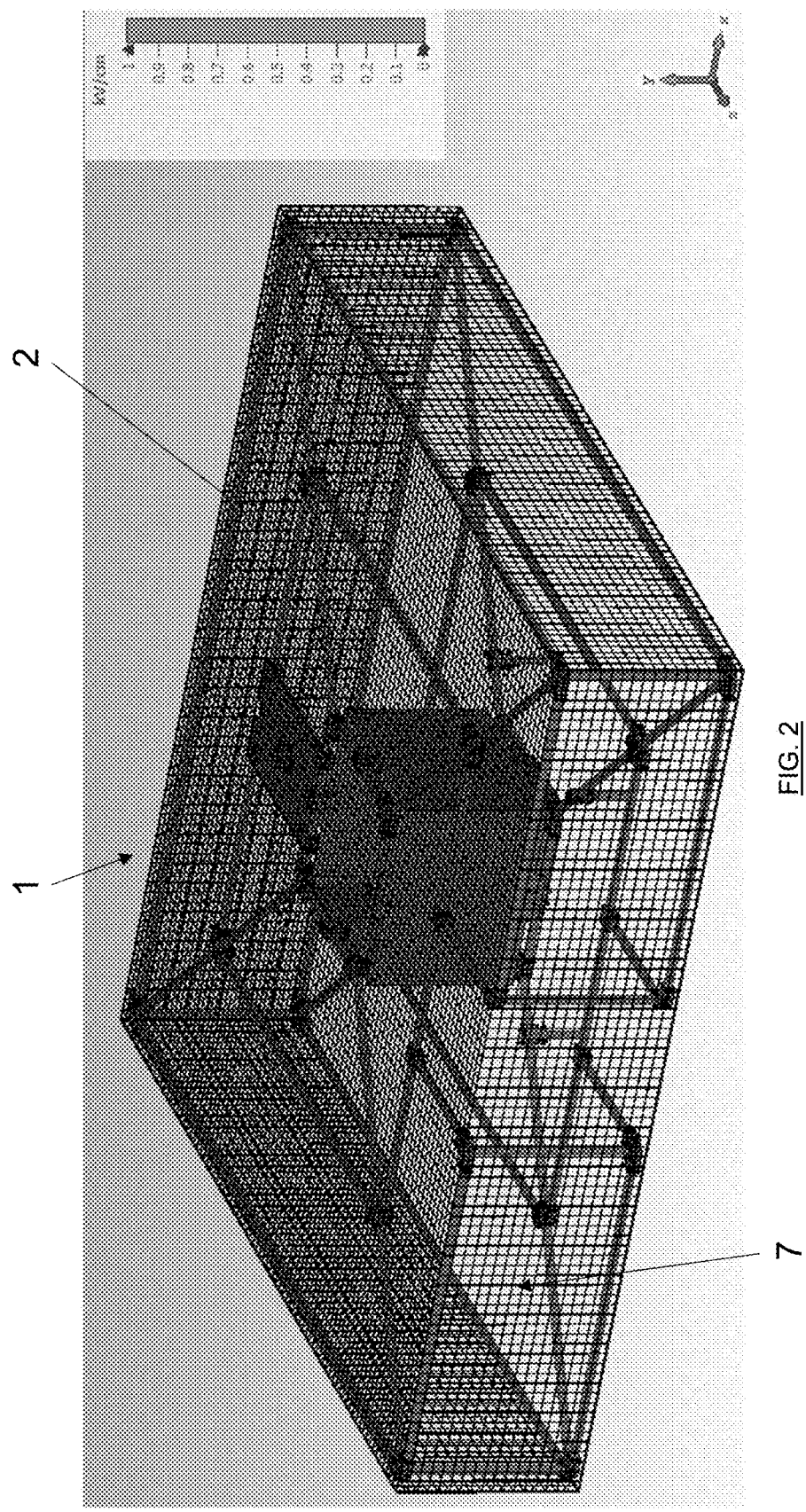
FIG. 2 is another perspective view of the device of FIG. 1B, showing in particular the metallic mesh partly covering the structure encasing the UAV and contributing to the efficiency of the Faraday cage.

As shown on FIGS. 1A, 1B and 2, the novel concept of the present disclosure is embodied in:

1) a protective frame 2 surrounding the mechanical structure 1 of a flying device;

2) this protective frame 2 being electrically conductive and;

3) this protective frame 2 being designed to guide electrical arcs outside the sensitive electrical parts of the flying device, such as electronics, sensors, antennas, etc. Protective frame 2 constitutes a Faraday cage.

In addition of providing a Faraday cage, said protecting frame 2 is supplemented, according to the present disclosure, at least by two anchoring spots 3 on its top, employed for connecting the flying device onto the energized conductors as well as for attracting possible electrical discharges towards the protective frame, in the approaching phase(s) of the conductor. This configuration implies that the flying device is designed to exclusively approach the power line from underneath. The anchoring spots may be provided with basic lightning arresters (rods) or may contain more sophisticated surge protection devices (for example according to the definitions given above). More advantageously, at least part of these anchoring spots shall be provided with two custom surge protectors or the like, preferably having a V-shape, not only for attracting possible electrical discharges but also for self-guiding the final phase of UAV landing on the power line. Once the power line is guided and engaged inside the V-shape of the surge protectors, an automatic closing and connection may be carried out, for example via clamps 6, known per se in prior art.

In an embodiment, the surrounding frame 2 has a common, electrically-connected grounding scheme. Then the energy of the surge just brings the right amount of charge to put the shield at the same potential as the power line. This energy is partially dissipated in the shielding and partially stored therein, without impacting the electronics functionality of the device. It should be noted that, when the device is anchored to the power line, the "ground" is then at the voltage of the line.

As a result, the improved protective frame according to the present disclosure is suitable to attract, guide and safely annihilate electrical arcs, through a path to ground via the Faraday cage, outside the perimeter or envelope of the flying device sensitive elements (e.g. electronics, sensors, propellers).

Accordingly, the present disclosure advantageously allows to use devices simply equipped with conventional electronics so that said devices will be protected in the phase of approaching and further when brought and maintained in contact with energized lines, but without compromising or impair the electrical and electronic functions of the device.

Further, to avoid possible residual spikes on the power supply of the flying device, a transient suppressor can be specifically connected in parallel with the ground and main power supply bus.

According to the embodiment shown on FIG. 2, a metallic mesh 7 deployed on the external conductive bars 20 is provided to further protect the sensitive electronic parts of the flying device by causing uniform distribution of the electrical arc paths across the mesh structure 7. This additional protection will ensure that the UAV is protected also when the device is approaching the line with a less ideal trajectory, such as by a lateral approach. It is to be noted that the metallic mesh 7 could be made of a regular wire mesh material surface, such as a thin copper foil, stretched over the frame of external conductive bars 20, but when the mesh covering is to be reduced for example (see below), it can also be made of a couple of wires linking the bars.

Advantageously, the mesh structure 7 shall cover at least the top part of the drone protective frame 2. On the bottom side of the drone protective frame 2 there is reduced mesh covering or with the mesh size is increased, because the power line approach is performed at proximity of the drone top and also in order to ensure optimal communication with the remote control on ground, while still needing some kind of conductive elements (to make a closed Faraday cage) on any side of the outer shield.

Figure 3:
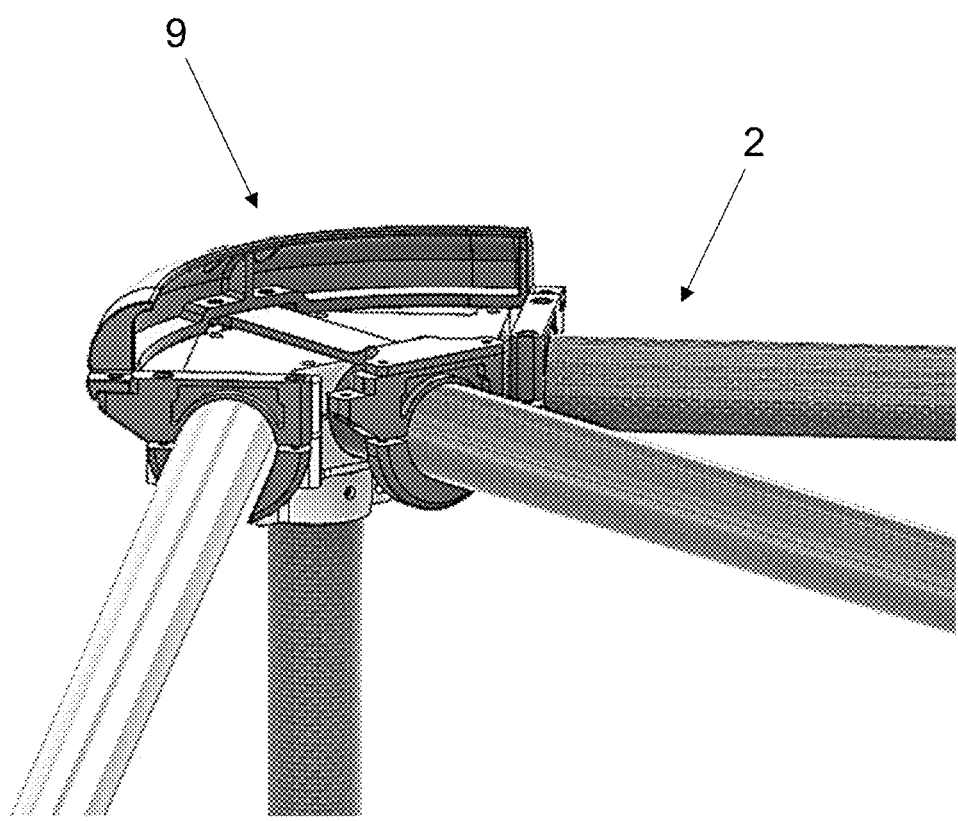
FIG. 3 is a detailed view of a rounded corner in the metallic structure supporting the shielding mesh.

According to the present disclosure, the design of the protective frame 2 shall specially be conceived with consideration of corona effect. Consequently, the edges thereof shall be particularly neat, and in particular shall not present any sharp point or spike and, where possible, round shapes could be preferred. For example, as shown on FIG. 3, special rounded corners could be provided as neat finish at the edges of the protective frame.

The frame design possibly including a metallic mesh embeds the flight engines and propellers 4, 8 allowing unimpeded air flow generated by the propellers through the device and ensuring, as mentioned above, that electrical arcs do not easily reach the most sensitive parts of the flying device (rotors, control unit, communication, inertial measurement unit-IMU, and GPS for example).

According to the preferred embodiment depicted in FIG. 1, the protective frame 2 shall consist in some kind of truss or lattice made of bars assembled according to a specific geometric layout and preferably built from carbon material, to ensure very good electrical conductivity. In flying applications (drone/UAV flights), such a light material is also considered in order not to penalize the payload of the device.

According to an embodiment, the junction parts of protective frame 2, as also shown on FIG. 1 and FIG. 2, are preferably made of polished aluminum, with round shapes to minimize corona discharges, connecting all the carbon bars together and ensuring a sufficiently good conductivity. The assembled bars in the frame are thereby supposed to be finished with round shapes and no sharp edge so as to reduce corona effect (see above). The carbon bars being made of multiple carbon fibers, surrounding them with the junction parts permits to ensure that all the fibers contribute to the conductivity, which allows to achieve a resistance between two extremities of the drone as low as possible, preferably below 1.5-2 Ohm, and more preferably below 1 Ohm.

The electrically conductive material composing the bars and connectors should be light, rigid, possibly 3D-printable and having a surface small enough, so as not to block air flow through the flying device. In addition to carbon and aluminum, for example titanium that can be 3D-printed or a material with an outside layer of copper can be used as well. However solid copper has the disadvantage to be heavier. Alternately the bars can be composed of non-conductive material coupled to some conductive material, for example plastic bars with metal wires incorporated in a groove thereof or with metal wire strapping.

Once the drone has been safely guided into the above-mentioned surge protectors opening, and provided to come into equipotential contact with the energized line, a firm connection of the drone can performed for example through closing with clamps, as described in prior art and in particular in patent application EP 3 832 822 A1, to the same Applicant.

Figure 4:
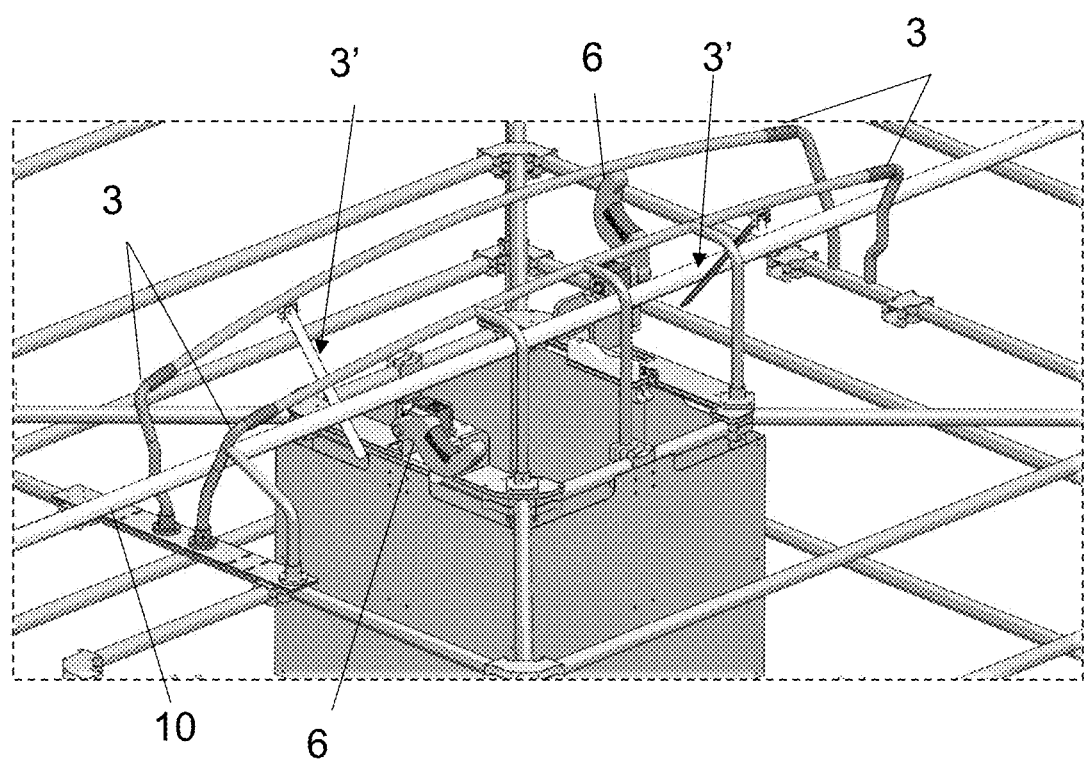
FIG. 4 is a detailed view of the surge arrester and clamping system also shown on FIG. 1A.

In the embodiment shown on FIG. 4, the mechanical parts with V-shape 3 are shown as well as the clamping devices 6 (any additional surge arrester or the like is not shown for sake of clarity). The clamping devices 6 have here the form of rotary claws, moving perpendicularly to the power line direction and clamping the line once it comes sufficiently close to the claws. In one embodiment, the clamping operation could be done automatically using some line detection device. In another embodiment, the claws are continuously rotating and clamp the line, once they come to grip with it and stop. In case there are two clamping claws, they will advantageously rotate in opposite directions.

LIST OF REFERENCE SYMBOLS 1 mechanical structure of the flying device
2 electrical shield
3 surge protector
3' additional conductive element
4 aircraft body
5 payload device-sensor (provided space shown)
6 automatic clamping device
7 metallic mesh
8 propeller
9 rounded corner bar connector
10 overhead power line
20 conductive bar (carbon)
21 connector (aluminum)

The invention claimed is:

1. A remotely-controlled flying device configured to approach and contact a high-voltage overhead power line for operation thereon, said flying device comprising:
   a plurality of propellers (8);
   a mechanical structure (1) bearing the plurality of propellers (8) and an aircraft body (4) containing at least a power hub, a flight controller, and radio communication means; and
   an electrical shield (2, 7) encapsulating said mechanical structure (1) and comprising a truss or lattice comprising an assembly of electrically-conductive bars (20) interconnected with electrically-conductive connectors (21);

wherein a top part of the remotely-controlled flying device comprises at least two anchoring spots, at least one of the anchoring spots provided with a surge protector or the like (3), wherein the anchoring spots comprise a mechanical part having a V-shape open to an exterior of the device configured to (a) guide the power line in a flying phase of approaching and contacting the power line, and (b) attract electric discharges towards the electrical shield (2, 7);

wherein at least two linearly-disposed automatic clamping devices (6) are located on the top part of the flying device (1), are located in a vicinity of the V-shaped mechanical part, and are configured to attach the flying device to the power line, once the flying device has approached the power line so that the power line is located sufficiently close to a bottom of the V-shaped mechanical part; and wherein the clamping devices (6) comprise claws mounted rotationally in a plane orthogonal to a direction of the power line in use, said claws configured to rotate continuously until the claws grip the power line and stop.

2. The remotely-controlled flying device according to claim 1, wherein said electrically-conductive bars (20) and connectors (21) have a round shape.

3. The remotely-controlled flying device according to claim 1, wherein said electrically-conductive bars (20) and connectors (21) are polished.

4. The remotely-controlled flying device according to claim 1, wherein each of said clamping devices (6) is coupled with one of said surge protectors or the like (3).

5. The remotely-controlled flying device according to claim 1, wherein an additional electrically-conductive element (3') is connected to the V-shaped mechanical part and configured to ensure that, once a first contact has been established with the high-voltage power line, contact remains active or permanent during subsequent operations/phases.

6. The remotely-controlled flying device according to claim 1, further comprising a metallic mesh (7) covering the top part and a lateral part of said assembly of electrically-conductive bars (20) interconnected with connectors (21), wherein the metallic mesh is configured to allow unimpeded air flow created by the rotation of the propellers.

7. The remotely-controlled flying device according to claim 6, wherein a bottom side of the flying device has reduced or partial metallic mesh (7) covering or has a metallic mesh (7) with increased mesh size, wherein the metallic mesh is configured to assure proper communication with a remote control on earth.

8. The remotely-controlled flying device according to claim 1, wherein the aircraft body (4) comprises conventional electronics not having special protection against high-intensity electromagnetic fields.

9. The remotely-controlled flying device according to claim 1, wherein the electrically-conductive bars (20) and the electrically-conductive connectors (21) are made of an electrically conductive material having a surface configured to be small enough so as not to hinder air flow.

10. The remotely-controlled flying device according to claim 9, wherein the electrically-conductive material is carbon, aluminum, titanium, copper, or a material with an outside layer of copper.

11. The remotely-controlled flying device according to claim 1, wherein the device is configured to bear a sensor (5) provided with dedicated clamps configured to automatically fixate the sensor (5) onto the power line, once the flying device has been firstly anchored to the power line and put at an electric potential of the power line.

12. The remotely-controlled flying device according to claim 1, wherein a transient suppressor is further electrically connected in parallel with ground and a main power supply bus.

13. The remotely-controlled flying device according to claim 1, wherein the electrical shield (2) is fitted to an external envelope of the mechanical structure (1).

14. A system comprising:
the remotely-controlled flying device according to claim 1, and
a hosted payload.

15. A method for anchoring a payload to a high-voltage overhead power line, the method comprising:
causing the remotely controlled flying device of claim 1 to approach a power line by remote control;
anchoring the flying device by guiding the high-voltage overhead power line into or towards the surge protectors or the like (3);
clamping the flying device to the power line utilizing the automatic clamping devices (6);
anchoring a payload device (5) utilizing a dedicated anchoring mechanism;
releasing the automatic clamping devices (6) and freeing the flying device (1) from the power line; and
bringing back the flying device to earth by remote control.

* * * * *